(12) United States Patent
Seon (10) Patent No.: US 10,509,059 B2
(45) Date of Patent: Dec. 17, 2019

(54) APPARATUS FOR DETECTING CURRENT

(71) Applicant: LSIS CO., LTD., Gyeonggi-do (KR)

(72) Inventor: Jong-Kug Seon, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 257 days.

(21) Appl. No.: 15/619,583

(22) Filed: Jun. 12, 2017

(65) Prior Publication Data
US 2018/0231589 A1 Aug. 16, 2018

(30) Foreign Application Priority Data

Feb. 15, 2017 (KR) .................. 10-2017-0020527

(51) Int. Cl.
*G01R 19/00* (2006.01)
*G01R 15/18* (2006.01)
(Continued)

(52) U.S. Cl.
CPC ......... *G01R 19/0092* (2013.01); *G01R 15/18* (2013.01); *G01R 19/175* (2013.01);
(Continued)

(58) Field of Classification Search
CPC ............... G01R 19/00; G01R 19/0092; G01R 19/16519; G01R 15/146; G01R 31/40;
(Continued)

(56) References Cited

U.S. PATENT DOCUMENTS 5,670,867 A * 9/1997 Mitsuda ........... G01R 19/16519
323/312
6,559,684 B2 * 5/2003 Goodfellow ..... G01R 19/16519
327/53
(Continued)

FOREIGN PATENT DOCUMENTS

JP       5224128 B2      3/2013
JP       2013-243838 A   12/2013
JP       2013-251854 A   12/2013

OTHER PUBLICATIONS

Yu-Huei Lee, et al; "Interleaving Energy-Conservation Mode (IECM) Control in Single-Inductor Dual-Output (SIDO) Step-Down Converters with 91% Peak Efficiency"; IEEE Journal of Solid-State Circuits; vol. 46, No. 4; Apr. 2011; (12 pages).
(Continued)

*Primary Examiner* — Steven L Yeninas
(74) *Attorney, Agent, or Firm* — K&L Gates LLP (57) ABSTRACT

The apparatus for detecting current includes: a charging stage having one end connected to a power source and another end connected to an inductor and configured to charge the inductor with a current; a discharging stage having one end connected to the inductor and another end connected to ground potential and configured to discharge the current charged in the inductor; and a detecting stage configured to detect a magnitude of a current flowing through the inductor based on a first output voltage output from a first output node of the charging stage when the inductor is charged by the charging stage or on a second
(Continued)

output voltage output from a second output node of the discharging stage when the inductor is discharged by the discharging stage.

10 Claims, 6 Drawing Sheets

(51) Int. Cl.
  *G01R 19/175* (2006.01)
  *H01L 23/522* (2006.01)
  *H01L 49/02* (2006.01)
  *H02M 1/00* (2006.01)

(52) U.S. Cl.
  CPC .......... *H01L 23/5227* (2013.01); *H01L 28/10* (2013.01); *H02M 2001/0009* (2013.01); *H03K 2217/0027* (2013.01)

(58) Field of Classification Search
  CPC .......... H02M 2001/0009; H02M 3/156; H03K 2217/0027
  USPC ..... 323/282, 283, 284, 285, 290; 324/123 R, 324/126, 713, 76.11; 327/53, 538, 109, 327/110; 361/93.1, 93.5
  See application file for complete search history.

(56) References Cited

U.S. PATENT DOCUMENTS

| | | | |
|---|---|---|---|
| 7,141,955 B1* | 11/2006 | Martinez | H03K 17/0822 323/272 |
| 7,251,178 B2 | 7/2007 | Gogl et al. | |
| 7,956,651 B2 | 6/2011 | Ptacek et al. | |
| 7,960,997 B2 | 6/2011 | Williams | |
| 9,798,347 B2* | 10/2017 | Sambucco | G05F 3/267 |
| 10,069,399 B1* | 9/2018 | Sambucco | H02M 1/088 |
| 2003/0184326 A1* | 10/2003 | Throngnumchai | H02M 1/32 324/713 |
| 2007/0263334 A1* | 11/2007 | Nishida | H02H 3/087 361/103 |
| 2008/0130330 A1 | 6/2008 | Tao | |
| 2008/0231246 A1* | 9/2008 | Sugie | G01R 19/0092 323/284 |
| 2009/0315527 A1 | 12/2009 | Kung et al. | |
| 2010/0277142 A1 | 11/2010 | Tan et al. | |
| 2012/0119718 A1* | 5/2012 | Song | H02M 3/1588 323/282 |
| 2014/0347119 A1 | 11/2014 | Vacca Cavalotto et al. | |
| 2015/0069990 A1* | 3/2015 | Feldtkeller | H02M 3/158 323/284 |
| 2015/0276812 A1 | 10/2015 | Ferguson | |
| 2015/0346247 A1* | 12/2015 | Mahajan | H02M 1/088 702/64 |
| 2015/0377933 A1 | 12/2015 | Alcouffe et al. | |
| 2016/0087626 A1 | 3/2016 | Kaeriyama | |
| 2016/0124027 A1 | 5/2016 | Sambucco et al. | |
| 2016/0231767 A1* | 8/2016 | Akaho | G05F 3/262 |
| 2016/0306371 A1* | 10/2016 | Svorc | H02M 3/1588 |
| 2016/0308524 A1 | 10/2016 | Inoue et al. | |

OTHER PUBLICATIONS

European Search Report for related European Application No. 17174200.0; dated Jan. 26, 2018; (13 pages).

* cited by examiner

FIG. 1

PRIOR ART

APPARATUS FOR DETECTING CURRENT

CROSS-REFERENCE TO RELATED APPLICATIONS

This application claims the benefit of Korean Patent Application No. 10-2017-0020527, filed on Feb. 15, 2017, entitled "APPARATUS FOR DETECTING CURRENT", which is hereby incorporated by reference in its entirety into this application.

BACKGROUND

1. Technical Field

The present disclosure relates to an apparatus for detecting current, and more specifically to an apparatus for detecting current flowing through an inductor based on output voltage output from transistors included in a charging stage and a discharging stage.

2. Description of the Related Art

In circuit design, in order to determine whether a designed circuit operates normally, a current flowing in a particular element of the circuit is measured or a voltage applied to the element is measured. If the measured current and voltage values lie within the error margin from the theoretical values, the developer determines that the circuit is operating normally.

Recently, passive elements capable of storing current and voltage have been employed to efficiently utilize power, and semiconductor elements such as transistors are being used to charge or discharge power in or from such passive elements.

As an example of such passive elements, an inductor can store current and can generate power by outputting stored current. The power generated by such an inductor can be measured by detecting a current flowing in the inductor or a voltage applied to the inductor when the inductor is charged or discharged. For example, when the inductor is charged or discharged according to the high-frequency switching, by detecting the current flowing through the inductor, it is possible to determine whether the circuit is operating normally and to measure the amount of electric energy stored in the inductor.

Figure 1:
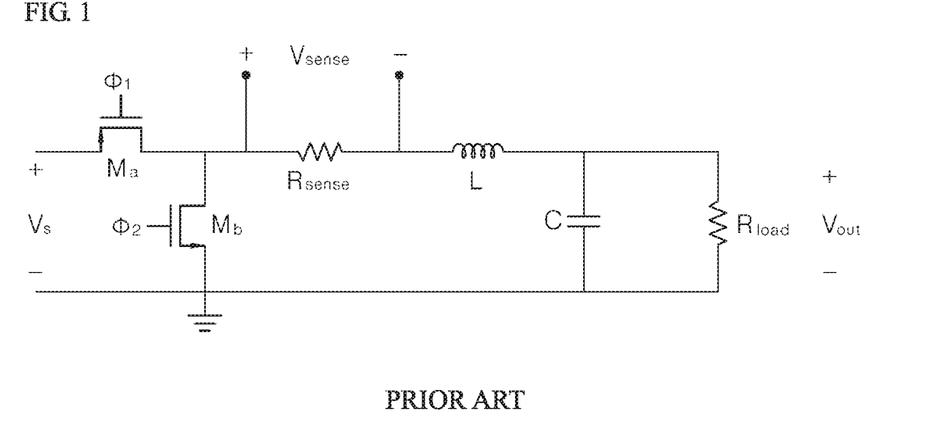
FIG. 1 is a circuit diagram for illustrating an existing circuit for detecting a current flowing in an inductor.

FIG. 1 is a circuit diagram for illustrating an existing circuit for detecting a current flowing in an inductor. Hereinafter, an existing method of detecting a current flowing through an inductor will be described in detail with reference to FIG. 1.

Referring to FIG. 1, when a transistor $M_a$ is turned on, and a transistor $M_b$ is turned off, a current generated by a power source $V_s$ flows through an inductor, such that the inductor is charged with the current. On the other hand, when the transistor $M_a$ is turned off and the transistor $M_b$ is turned on, the current charged in the inductor is discharged through the transistor $M_b$. The operating phase $\phi_1$ of the transistor $M_a$ is set to be opposite to the operating phase $\phi_2$ of the transistor $M_b$, so that the inductor is charged and discharged repeatedly.

According to the existing method for detecting the current, a voltage $V_{sense}$ across a precision resistor $R_{sense}$ connected in series with the inductor is detected, and the voltage is amplified to detect a current flowing in the inductor. However, such a method has a problem in that it requires the expensive precision resistor $R_{sense}$ and thus it is costly to design the circuit.

In addition, according to the existing method, since the precision resistor $R_{sense}$ having a very small resistance is used, the magnitude of the voltage $V_{sense}$ applied to the precision resistor $R_{sense}$ is also very small. Accordingly, there is a problem in that the accuracy of current detection is lowered in the process of amplifying it.

Further, according to the existing method, since energy is additionally lost by the precision resistor $R_{sense}$, there are problems in that the power cannot be used efficiently, and therefore, it is difficult to use it in a low-power circuit.

SUMMARY

It is an object of the present disclosure to provide an apparatus for detecting current capable of allowing the circuit to be highly integrated and saving power loss by way of using transistors instead of the expensive precision resistor in measuring the current flowing through the inductor.

It is another object of the present disclosure to provide an apparatus for detecting current capable of improving the stability of the circuit for detecting current by way of using the transistor that remains turned on all the time to reduce the output voltage output from the inductor.

It is another object of the present disclosure to provide an apparatus for detecting current in which the output voltage output from the transistor is reduced according to the width of the transistor, such that the magnitude of the output voltage to be detected can be adjusted appropriately.

It is another object of the present disclosure to provide an apparatus for detecting current capable of improving accuracy of the detection by way of configuring the circuit so that the voltage applied to the sensing resistor is proportional to the current flowing in the inductor.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, an apparatus for detecting current includes: a charging stage having one end connected to a power source and another end connected to an inductor and configured to charge the inductor with a current; a discharging stage having one end connected to the inductor and another end connected to ground potential and configured to discharge the current charged in the inductor; and a detecting stage configured to detect a magnitude of a current flowing through the inductor based on a first output voltage output from a first output node of the charging stage when the inductor is charged by the charging stage or on a second output voltage output from a second output node of the discharging stage when the inductor is discharged by the discharging stage.

According to an exemplary embodiment of the present disclosure, by using transistors instead of the expensive precision resistor in measuring the current flowing through the inductor, the circuit can be integrated and the power loss can be reduced.

According to an exemplary embodiment of the present disclosure, by using the transistor that remains turned on all the time to reduce the output voltage output from the inductor, the stability of the circuit for detecting current can be improved.

According to an exemplary embodiment of the present disclosure, the output voltage output from the transistor is reduced according to the width of the transistor, such that the magnitude of the output voltage to be detected can be adjusted appropriately.

According to an exemplary embodiment of the present disclosure, the accuracy of the detection can be improved by way of configuring the circuit so that the voltage applied to the sensing resistor is proportional to the current flowing in the inductor.

DETAILED DESCRIPTION

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Figure 2:
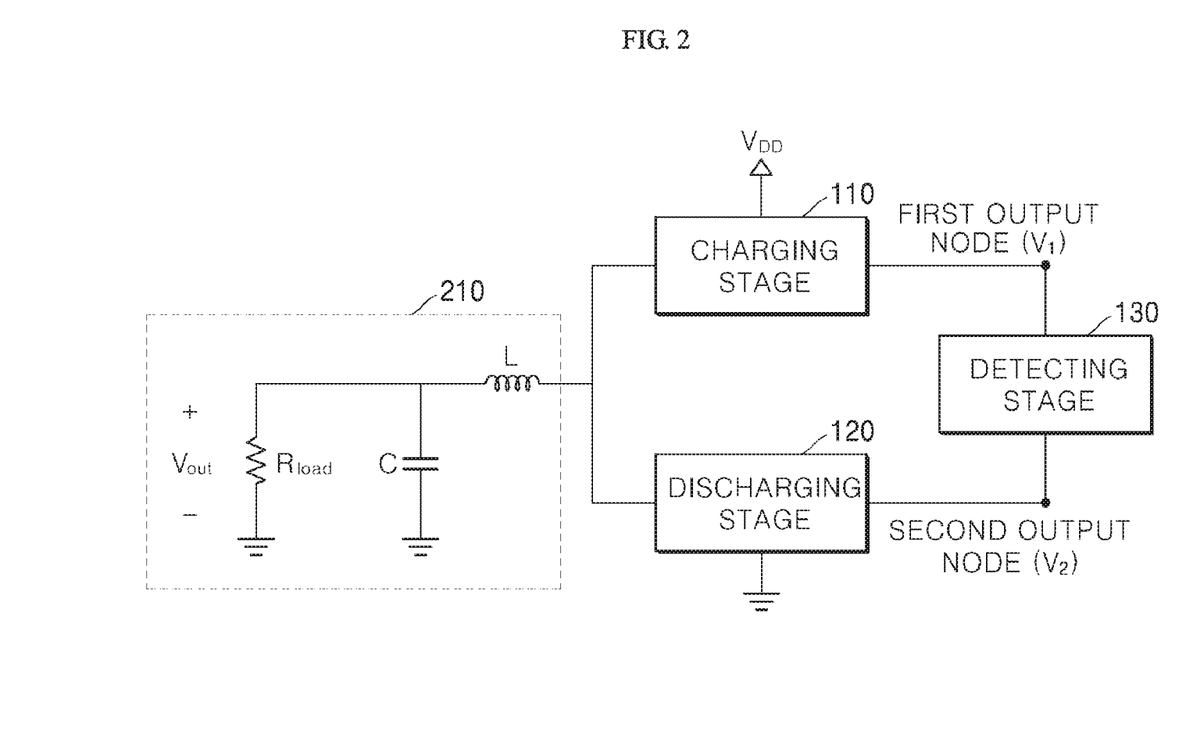
FIG. 2 is a diagram for illustrating an apparatus for detecting current according to an exemplary embodiment of the present disclosure, connected to a passive circuit.

FIG. 2 is a diagram for illustrating an apparatus for detecting current according to an exemplary embodiment of the present disclosure, connected to a passive circuit. Referring to FIG. 2, the apparatus for detecting current according to the exemplary embodiment of the present disclosure includes a charging stage 110, a discharging stage 120, and a detecting stage 130. The apparatus shown in FIG. 2 is merely an exemplary embodiment of the present disclosure, and the elements are not limited to those shown in FIG. 2. Some elements may be added, modified or eliminated as desired.

The present disclosure relates to an apparatus for detecting current flowing through an inductor, and more particularly, to an apparatus for detecting the magnitude of a current flowing through an inductor when the inductor is charged or discharged according to high-frequency switching.

Referring to FIG. 2, one end of the charging stage 110 is connected to a power source $V_{DD}$ and the other end thereof is connected to an inductor to charge the inductor. In addition, one end of the discharging stage 120 is connected the inductor and the other end thereof is connected to the ground potential to discharge the current in the inductor.

The inductor may be included in a passive circuit 210 composed of passive elements that do not generate electrical energy. The passive circuit 210 may be configured in other forms than that shown in FIG. 2, as long as the inductor is charged/discharged by an external power source.

When the charging stage 110 charges the current in the inductor, a first output voltage $V_1$ may be output from a first output node of the charging stage 110. When the discharging stage 120 discharges the current charged in the inductor, a second output voltage $V_9$ may be output from a second output node of the discharging stage 120.

The detecting stage 130 may detect the magnitude of the current flowing in the inductor based on the first output voltage $V_1$ outputted from the first output node or the second output voltage $V_2$ outputted from the second output node.

Figure 3:
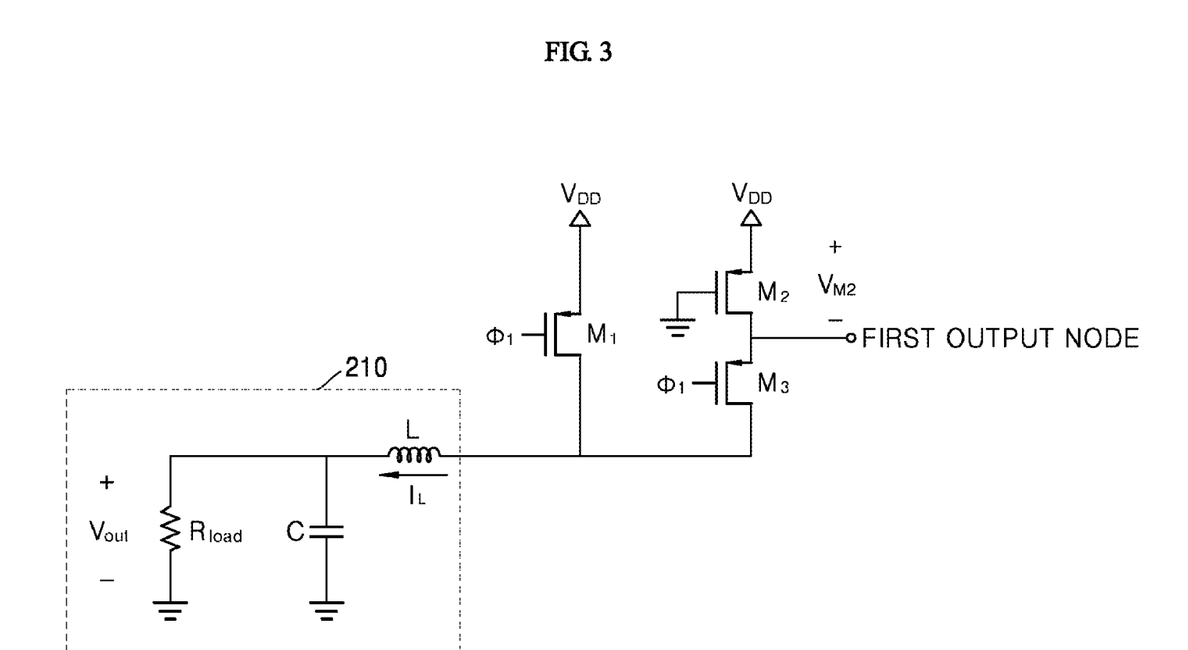
FIG. 3 is a circuit diagram for illustrating the charging stage charging the current in the inductor.

FIG. 3 is a circuit diagram for illustrating the charging stage 110 charging the current in the inductor. Hereinafter, the charging stage 110 will be described in more detail with reference to FIG. 3.

Referring to FIG. 3, the charging stage 110 may include a first main transistor $M_1$ having one end connected to the power source $V_{DD}$ and another end connected to the inductor; a first turn-on transistor $M_2$ having one end connected to the power source $V_{DD}$ and another end connected to the first output node such that it remains turned on all the time; and a first sub-transistor $M_3$ having one end connected to the first output node and another end connected to the inductor.

The first turn-on transistor $M_2$ may have its gate terminal connected to the ground potential such that it remains turned on all the time. The first turn-on transistor $M_2$ remains turned on so as to distribute the voltage between the power source $V_{DD}$ and the inductor, and may function as a resistor when the inductor is charged.

The inductor may be charged with the power source $V_{DD}$ when the first main transistor $M_1$ and the first sub-transistor $M_3$ are turned on. More specifically; when the first main transistor $M_1$ and the first sub-transistor $M_3$ are turned off, the power source $V_{DD}$ and the inductor are separated from each other. When the first main transistor $M_1$ and the first sub-transistor $M_3$ are turned on, the power source $V_{DD}$ is connected to the inductor.

When the power source $V_{DD}$ is connected to the inductor, a current flows in the inductor by the voltage applied from the power source $V_{DD}$. The current flowing in the inductor may flow in the direction from the power source $V_{DD}$ to the passive circuit 210.

The first main transistor $M_1$ and the first sub-transistor $M_3$ may operate in accordance with the first operating phase $\phi_1$, The operating phase refers to a period in which a transistor is turned on and off. The first main transistor $M_1$ and the first sub-transistor $M_3$ may be turned on or off according to the first operating phase $\phi_1$.

The first output node of the charging stage 110 may be the node between the first turn-on transistor $M_2$ and the first sub-transistor $M_3$. The first output voltage $V_1$ output from the first output node may be determined according to the width of the transistors included in the charging stage 110.

More specifically, the first output voltage $V_1$ may be determined according to a ratio of the width of the first main transistor $M_1$ to the width of the first sub-transistor $M_3$ and the first turn-on transistor $M_2$, and the magnitude of the current flowing in the inductor.

The width of a transistor is a parameter that determines the magnitude of the current flowing through the transistor and may be determined by the performance of the transistor. More specifically, assuming that the other performances than width is the same, the current flowing through a transistor may be proportional to the width of the transistor.

In the exemplary embodiment of the present disclosure, the ratio of the width of the first main transistor $M_1$ to the width of the first sub-transistor $M_3$ and the first turn-on transistor $M_2$ may be m. For example, if the width of the first sub-transistor $M_3$ and the first turn-on transistor $M_2$ is equal to 0.1 μm and the width of the first main transistor $M_1$ is equal to 0.7 μm, the value of m may be equal to 7.

Accordingly, when the first main transistor $M_1$, the first sub-transistor $M_3$ and the first turn-on transistor $M_2$ have the same performances except for their width, the magnitude of the current flowing through the first main transistor $M_1$ may be equal to m times the magnitude of the current flowing through the first sub-transistor $M_3$ and the first turn-on transistor $M_2$.

Accordingly, referring again to FIG. 3, assuming that the magnitude of the current flowing through the first sub-transistor $M_3$ and the first turn-on transistor $M_2$ is I, the magnitude of the current flowing through the first main transistor $M_1$ may be mI. Since the sum of mI and I becomes the current $I_L$ flowing through the inductor, the following equation can be established: $I=I_L/(m+1)$.

When the first main transistor $M_1$ and the first sub-transistor $M_3$ of the charging stage 110 are turned on in the high-frequency switching operation, the first turn-on transistor $M_2$ may work as a resistor as described above. Accordingly, the voltage applied to the first turn-on transistor $M_2$ may be a product of the current flowing in the first turn-on transistor $M_2$ and the turn-on resistance of the first turn-on transistor $M_2$.

For example, if the turn-on resistance of the first turn-on transistor $M_2$ is $R_2$, then the voltage $V_{M2}$ applied to the first turn-on transistor $M_2$ can be represented by $$I_L \times \frac{R_2}{m+1}.$$

Assuming that the voltage of the power source is $V_{DD}$, the first output voltage output from the first output node can be expressed by Equation 1 below:

$$V_1 = V_{DD} - I_L \times \frac{R_2}{m+1} \qquad \langle \text{Equation 1} \rangle$$

where $V_1$ denotes the first output voltage, $V_{DD}$ denotes the voltage of the power source, $I_L$ denotes the current flowing in the inductor, m denotes the ratio of the width of the first main transistor to the width of the first sub-transistor and the first turn-on transistor, and $R_2$ denotes the turn-on resistance of the first turn-on transistor.

Figure 4:
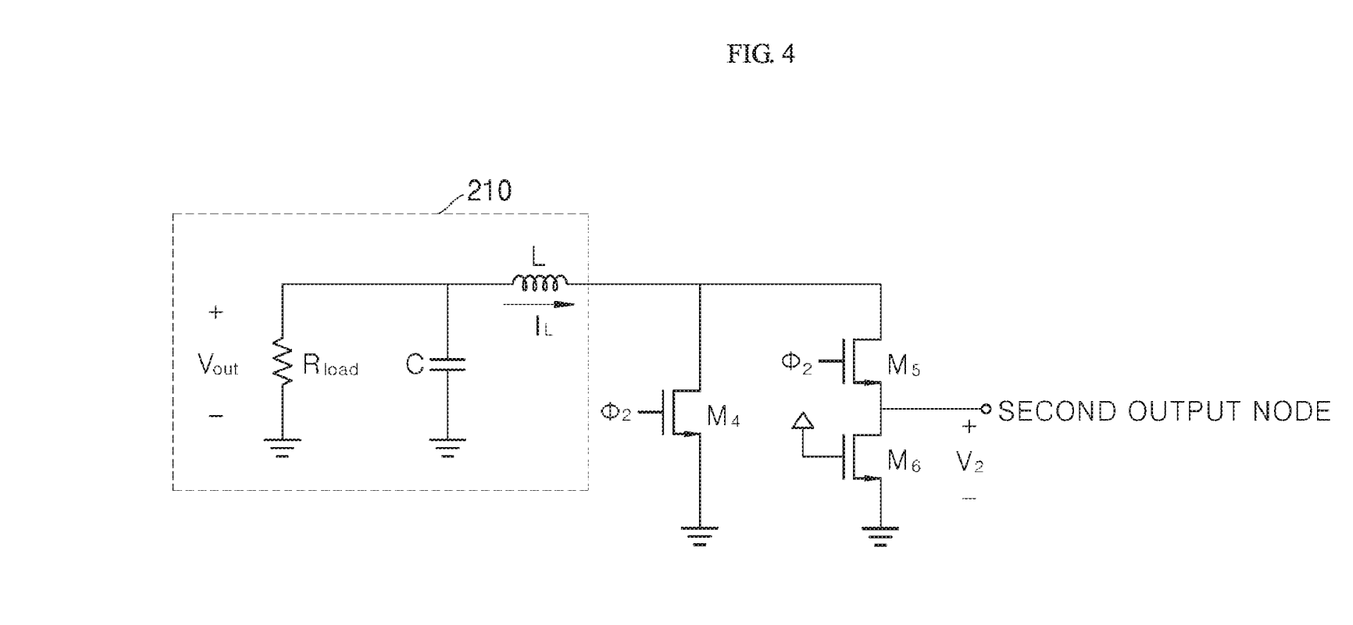
FIG. 4 is a circuit diagram for illustrating the discharging stage discharging the current charged in the inductor.

FIG. 4 is a circuit diagram for illustrating the discharging stage 120 discharging the current charged in the inductor. Hereinafter, the discharging stage 120 will be described in more detail with reference to FIG. 4.

Referring to FIG. 4, the discharging stage 120 includes: a second main transistor $M_4$ having one end connected to the inductor and another end connected to the ground potential; a second sub-transistor $M_5$ having one end connected to the inductor and another end connected to the second output node $M_5$; and a second turn-on transistor $M_6$ having one end connected to the second output node and another end connected to the ground potential.

The gate terminal of the second turn-on transistor $M_6$ may be connected to the power source so that it remains turned on all the time. The second turn-on transistor $M_2$ remains turned on so as to divide the voltage between the voltage at the inductor and the ground potential, and may work as a resistor when the inductor is discharged.

The current charged in the inductor may be discharged onto the ground when the second main transistor $M_4$ and the second sub-transistor $M_5$ are turned on. More specifically, when the second main transistor $M_4$ and the second sub-transistor $M_5$ are turned off, one end of the inductor is not connected to the ground potential. When the second main transistor $M_4$ and the second sub-transistor $M_5$ are turned on, the end of the inductor is connected to the ground potential.

When the end of the inductor is connected to the ground potential, the current charged in the inductor can be discharged onto the ground, so that the current flowing in the inductor can flow in the direction from the inductor to the ground.

The second main transistor $M_4$ and the second sub-transistor $M_5$ may operate in accordance with the second operating phase $\phi_2$. The second operating phase $\phi_2$ may be opposite to the first operating phase $\phi_1$ of the transistors included in the charging stage 110. The second main transistor $M_4$ and the second sub-transistor $M_5$ may be turned on and turned off in accordance with the second operating phase $\phi_2$, and accordingly, the inductor may be charged and discharged repeatedly at regular intervals.

The second output node of the discharging stage 120 may be the node between the second sub-transistor $M_5$ and the second turn-on transistor $M_6$. The second output voltage $V_2$ output from the second output node may be determined according to the width of the transistors included in the discharging stage 120.

More specifically, the second output voltage $V_2$ may be determined according to a ratio of the width of the second main transistor $M_4$ to the width of the second sub-transistor $M_5$ and the second turn-on transistor $M_6$, and the magnitude of the current flowing through the inductor.

In the exemplary embodiment of the present disclosure, the ratio of the width of the second main transistor $M_4$ to the width of the second sub-transistor $M_5$ and the second turn-on transistor $M_6$ may be n. For example, if the width of the second sub-transistor $M_5$ and the second turn-on transistor $M_6$ is equal to 0.05 μm and the width of the second main transistor $M_4$ is equal to 0.5 μm, the value of n may be equal to 10.

Accordingly, when the second main transistor $M_4$, the second sub-transistor $M_5$ and the second turn-on transistor $M_6$ have the same performances except for their width, the magnitude of the current flowing through the second main transistor $M_4$ may be equal to n times the magnitude of the current flowing through the second sub-transistor $M_5$ and the second turn-on transistor $M_6$.

Accordingly, referring again to FIG. 4, assuming that the magnitude of the current flowing through the second sub-transistor $M_5$ and the second turn-on transistor $M_6$ is I, the magnitude of the current flowing through the second main transistor $M_4$ may be nI. Since the current $I_L$ flowing from the inductor toward the ground is divided into I and nI, the following equation can be established: $I=I_L/(n+1)$.

When the second main transistor $M_4$ and the second sub-transistor $M_5$ of the discharging stage 120 are turned on in the high-frequency switching operation, the second turn-on transistor $M_6$ may work as a resistor as described above. Accordingly, the voltage applied to the second turn-on transistor $M_6$ may be a product of the current flowing in the second turn-on transistor $M_6$ and the turn-on resistance of the second turn-on transistor $M_6$.

For example, if the turn-on resistance of the second turn-on transistor $M_6$ is $R_6$, then the voltage $V_{M6}$ applied to the second turn-on transistor $M_6$ can be represented by $$I_L \times \frac{R_6}{n+1}.$$

Since the voltage applied to the second turn-on transistor $M_6$ is equal to the second output voltage $V_2$ output from the second output node, the output voltage $V_2$ can be expressed by Equation 2 below:

$$V_2 = I_L \times \frac{R_6}{n+1} \qquad \langle \text{Equation 2} \rangle$$

where $V_2$ denotes the second output voltage, $I_L$ denotes the current flowing through the inductor, n denotes the ratio of the width of the second main transistor to the width of the second sub-transistor and the second turn-on transistor, and $R_6$ denotes the turn-on resistance of the second turn-on transistor.

As described later, the high voltage output from the inductor causes an excessively large current to flow in a sensing resistor $R_S$, so that the circuit may become unstable. As described above, by using the transistor that remains turned on all the time to reduce the output voltage output from the inductor, it is possible to improve the stability of the circuit for detecting current.

In addition, according to an exemplary embodiment of the present disclosure, the output voltages (the first output voltage and the second output voltage) output through the transistors set in advance are reduced in accordance with the width of the transistors, so that the magnitude of the output voltage to be detected can be appropriately adjusted.

Figure 5:
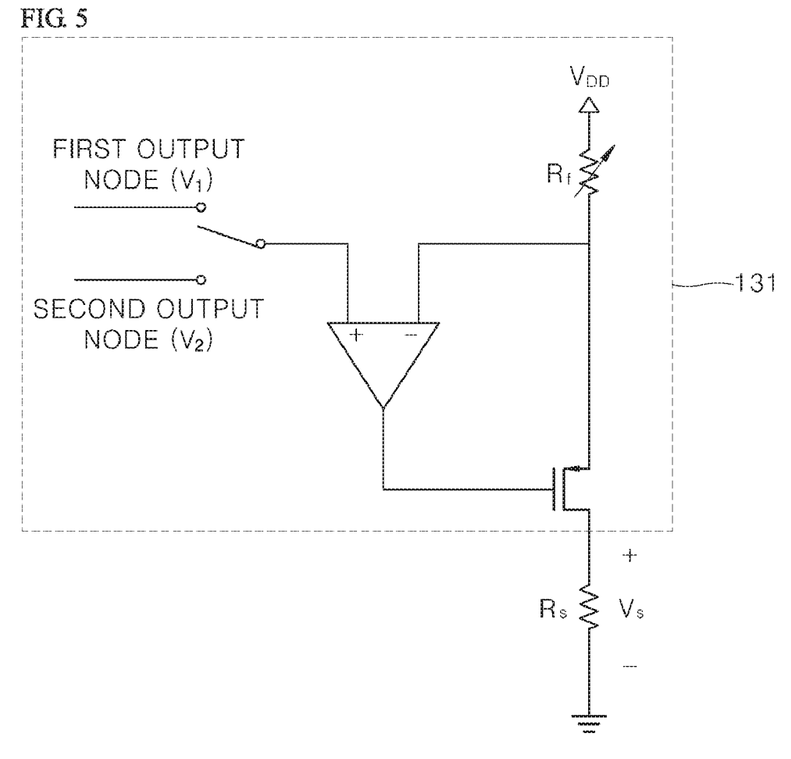
FIG. 5 is a circuit diagram for illustrating the detecting stage connected to the output node of the charging stage or the discharging stage.

FIG. 5 is a circuit diagram for illustrating the detecting stage 130 connected to the output node of the charging stage 110 or the discharging stage 120 Hereinafter, the detecting stage 130 will be described in more detail with reference to FIG. 5.

Referring to FIG. 5, the detecting stage 130 may include a sensing resistor $R_s$, and a current application stage 131 that applies a current to the sensing resistor $R_s$ according to the first output voltage $V_1$ or the second output voltage $V_2$. The current application stage 131 is a circuit that can selectively receive the first output voltage $V_1$ or the second output voltage $V_2$ and can apply a current to the sensing resistor $R_s$ according to the input voltage.

The detecting stage 130 can detect the magnitude of the current flowing through the inductor based on the voltage $V_s$ applied to the sensing resistor $R_s$. More specifically, the voltage $V_s$ applied to the sensing $R_s$ may be measured according to the first output voltage $V_1$ or the second output voltage $V_2$. As described above, the first output voltage $V_1$ and the second output voltage $V_2$ contain information on the magnitude of the current flowing in the inductor. Accordingly, the detecting stage 130 detects the magnitude of the current flowing in the inductor based on the voltage $V_s$ measured across the sensing resistor $R_s$.

Referring again to FIG. 5, the current application stage 131 may include a feedback resistor $R_f$, a differential amplifier, and an output terminal transistor. The current application stage 131 may include any constant-current source circuit known in the field of electronic circuit as long as it includes a feedback resistor, a differential amplifier and an output terminal transistor to supply a constant current, as well as the circuit shown in FIG. 5. The current application stage 131 shown in FIG. 5 is merely an example. The current application stage 131 may be modified into various types of current sources for supplying a constant current to the sensing resistor $R_s$.

The differential amplifier may include a first input terminal connected to the first output node or the second output node, a second input terminal connected to one end of the feedback resistor $R_f$, and an output terminal connected to the output terminal transistor. The current application stage 131 includes the differential amplifier thus configured, so that it can adjust the magnitude of the current flowing in the sensing resistor $R_s$ according to the feedback resistor $R_f$.

The first input terminal of the differential amplifier may be selectively connected to the first output node or the second output node. More specifically, the first input terminal may be connected to the first output node when the charging stage 110 charges the current in the inductor, and may be connected to the second output node when the discharging stage 120 discharges the current charged in the inductor.

To this end, the differential amplifier may further include a switching element at one end of the first input terminal, which operates according to a charging or discharging period. The switching element may be configured by using a multiplexer (MUX).

In order for the differential amplifier to operate normally, the magnitude of the voltage applied to the first input terminal and the second input terminal may have a certain range. Accordingly, the current application stage 131 may further include a level shifter for changing the magnitude of the voltage applied to the first input terminal or the second input terminal.

The level shifter may change the magnitude of the first output voltage $V_1$ or the second output voltage $V_2$ output from the first output node or the second output node to apply it to the first input terminal of the differential amplifier. Further, the level shifter may change the magnitude of the voltage output at one end of the feedback resistor $R_f$ to apply it to the second input terminal of the differential amplifier.

Figure 6:
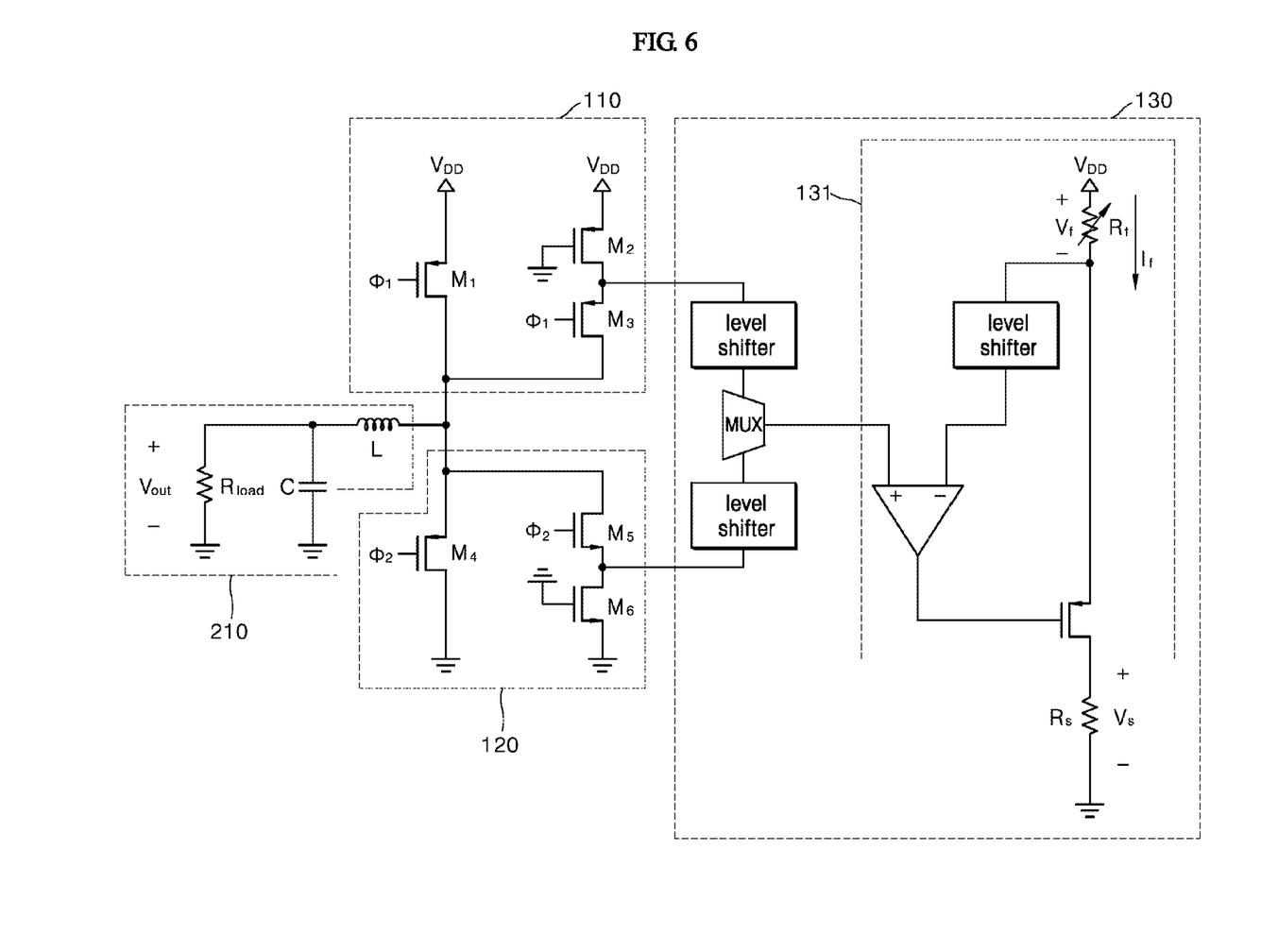
FIG. 6 is a circuit diagram for illustrating the apparatus for detecting current according to an exemplary embodiment of the present disclosure, connected to a passive circuit.

FIG. 6 is a circuit diagram for illustrating the apparatus for detecting current according to an exemplary embodiment of the present disclosure, connected to a passive circuit. Hereinafter, the overall operation of the apparatus for detecting current and the method for measuring the voltage $V_s$ applied to the sensing resistor $R_s$ will be described in detail with reference to FIG. 6.

First, when the transistors $M_1$ and $M_3$ included in the charging stage 110 are turned on, the transistors $M_4$ and $M_5$ included in the discharging stage 120 are turned off. Accordingly, the charging stage 110 supplies the current to the passive circuit 210 using the voltage from the power source $V_{DD}$, and the inductor is charged with the supplied current. The first output voltage $V_1$ output from the first output node may be expressed by $$V_1 = V_{DD} - I_L \times \frac{R_2}{m+1},$$

as described above.

Since the voltage input to the first input terminal of the differential amplifier and the voltage input to the second input terminal are kept at the same level, the first output voltage $V_1$ is equal to the voltage output from one end of the feedback resistor $R_f$. Referring again to FIG. 6, the voltage applied to the feedback resistor $R_f$ is expressed by $V_f=R_f \times I_f$, and the voltage output from one end of the feedback resistor $R_f$ is expressed by $V_{DD}-V_f$. Accordingly, the relationship $$V_f = I_L \times \frac{R_2}{m+1}$$

is established.

On the other hand, the voltage applied to the sensing resistor $R_s$ is expressed by $V_s=R_s \times I_f$, and the relationship is established, such that the relationship $$I_f = \frac{V_f}{R_f}$$

$$V_s = \frac{R_s \times V_f}{R_f}$$

is established. As described above, the equation $$V_f = I_L \times \frac{R_2}{m+1}$$

is established, the voltage applied to the sensing resistor $R_s$ when the inductor is charged by the charging stage 110 can be expressed by Equation 3 below:

$$V_s = I_L \times \frac{R_s \times R_2}{(m+1) \times R_f} \qquad \langle \text{Equation 3} \rangle$$

where $V_s$ denotes the voltage applied to the sensing resistor, $I_L$ denotes the current flowing in the inductor, $R_s$ denotes the sensing resistor, $R_2$ denotes the turn-on resistance of the first turn-on transistor, $R_f$ denotes the feedback resistor, and m denotes the ratio of the width of the first main transistor to the width of the first sub-transistor and the first turn-on transistor.

On the other hand, when the transistors $M_4$ and $M_5$ included in the discharging stage 120 are turned on, the transistors $M_1$ and $M_3$ included in the charging stage 110 are turned off. Accordingly, the discharging stage 120 discharges the current charged in the inductor onto the ground. The second output voltage $V_2$ output from the second output node may be expressed by $$V_2 = I_L \times \frac{R_6}{n+1},$$

as described above.

Since the voltage input to the first input terminal of the differential amplifier and the voltage input to the second input terminal are kept at the same level, the second output voltage $V_2$ is equal to the voltage output from one end of the feedback resistor $R_f$. As described above, the voltage output from the one end of the feedback resistor $R_f$ is expressed by $V_{DD}-V_f$, and thus it is expressed by $$V_f = V_{DD} - I_L \times \frac{R_6}{n+1}.$$

On the other hand, the voltage applied to the sensing resistor $R_s$ is expressed by $V_s=R_s \times I_f$, and the relationship $$I_f = \frac{V_f}{R_f}$$

is established, such that the relationship $$V_s = \frac{R_s \times V_f}{R_f}$$

is established. As described above, the equation $$V_f = V_{DD} - I_L \times \frac{R_6}{n+1}$$

is established, the voltage applied to the sensing resistor $R_s$ when the inductor is charged by the charging stage 120 can be expressed by Equation 4 below:

$$V_s = \frac{R_s}{R_f}\left(V_{dd} - I_L \times \frac{R_6}{n+1}\right) \qquad \langle \text{Equation 4} \rangle$$

where $V_s$ denotes the voltage applied the sensing resistor, $V_{DD}$ denotes the voltage of the power source, $I_L$ denotes the current flowing in the inductor, $R_s$ denotes the sensing resistor, $R_6$ denotes the turn-on resistor of the second turn-on transistor, $R_f$ denotes the feedback resistor, and n denotes the ratio of the width of the second main transistor to the width of the second sub-transistor and the second turn-on transistor.

As described above, according to an exemplary embodiment of the present disclosure, the voltage applied to the sensing resistor $R_s$ is proportional to the current flowing in the inductor, thereby improving accuracy of detection. As a result, by using the transistors instead of the expensive precision resistor in measuring the current flowing through the inductor, the circuit can be highly integrated, the power loss can be reduced, and the accuracy of the current detection can be improved.

The present disclosure described above may be variously substituted, altered, and modified by those skilled in the art to which the present invention pertains without departing from the scope and sprit of the present disclosure. Therefore, the present disclosure is not limited to the above-mentioned exemplary embodiments and the accompanying drawings.

What is claimed is:
1. An apparatus for detecting a current flowing through an inductor, the apparatus comprising:
a charging stage having one end connected to a power source and another end connected to an inductor and configured to operate in accordance with a first operating phase to charge the inductor with a current;

a discharging stage having one end connected to the inductor and another end connected to ground potential and configured to operate in accordance with a second operating phase which is opposite to the first operating phase to discharge the current charged in the inductor; and a detecting stage configured to detect a magnitude of a current flowing through the inductor based on a first output voltage output from a first output node of the charging stage when the inductor is charged by the charging stage or on a second output voltage output from a second output node of the discharging stage when the inductor is discharged by the discharging stage, wherein the detecting stage comprises:
   a sensing resistor;
   a feedback resistor;
   an output terminal transistor; and
   a differential amplifier comprising a first input terminal connected to the first output node or the second output node, a second input terminal connected to one end of the feedback resistor, and an output terminal connected to the output terminal transistor, wherein a resistance value of the feedback resistor is set so that voltages at the first input terminal and the second input terminal of the differential amplifier are the same, wherein the apparatus further comprises a switching element at one end of the first input terminal of the differential amplifier, and the switching element operates according to the first operating phase or the second operating phase.

2. The apparatus of claim 1, wherein the charging stage comprises:
   a first main transistor having one end connected to the power source and another end connected to the inductor;
   a first turn-on transistor having one end connected to the power source and another end connected to the first output node and remaining turned on; and
   a first sub-transistor having one end connected to the first output node and another end connected to the inductor, and wherein the discharging stage comprises:
   a second main transistor having one end connected to the inductor and another end connected to ground potential;
   a second sub-transistor having one end connected to the inductor and another end connected to the second output node; and
   a second turn-on transistor having one end connected to the second output node and another end connected to the ground potential.

3. The apparatus of claim 2, wherein the inductor is charged with current by the power source when the first main transistor and the first sub-transistor are turned on, and wherein the current charged in the inductor is discharged when the second main transistor and the second sub-transistor are turned on.

4. The apparatus of claim 2, wherein the first output voltage is determined by a ratio of a width of the first main transistor to a width of the first sub-transistor and the first turn-on transistor and the magnitude of the current flowing in the inductor, and wherein the second output voltage is determined by a ratio of a width of the second main transistor to a width of the second sub-transistor and the second turn-on transistor and the magnitude of the current flowing in the inductor.

5. The apparatus of claim 2, wherein the first output voltage is expressed by $$V_1 = V_{DD} - I_L \times \frac{R_2}{M+1}$$

where $V_1$ denotes the first output voltage, VDD denotes the voltage of the power source, IL denotes the current flowing in the inductor, m denotes the ratio of the width of the first main transistor to the width of the first sub-transistor and the first turn-on transistor, and $R_2$ denotes the turn-on resistance of the first turn-on transistor.

6. The apparatus of claim 2, wherein the second output voltage is expressed by $$V_2 = I_L \times \frac{R_6}{n+1}$$

where $V_2$ denotes the second output voltage, IL denotes the current flowing in the inductor, n denotes the ratio of the width of the second main transistor to the width of the second sub-transistor and the second turn-on transistor, and $R_6$ denotes the turn-on resistance of the second turn-on transistor.

7. The apparatus of claim 1,
   wherein the detecting stage detects the magnitude of the current flowing through the inductor based on a voltage applied to the sensing resistor.

8. The apparatus of claim 2, wherein a voltage applied to the sensing resistor when the inductor is charged by the charging stage is expressed by $$V_s = I_L \times \frac{R_s \times R_2}{(m+1) \times R_f}$$

where $V_s$ denotes a voltage applied to the sensing resistor, IL denotes the current flowing in the inductor, $R_s$ denotes the sensing resistor, $R_2$ denotes the turn-on resistance of the first turn-on transistor, $R_f$ denotes the feedback resistor, and m denotes the ratio of the width of the first main transistor to the width of the first sub-transistor and the first turn-on transistor.

9. The apparatus of claim 2, wherein a voltage applied to the sensing resistor when the inductor is discharged by the discharging stage is expressed by $$V_s = \frac{R_s}{R_f}\left(V_{DD} - I_L \times \frac{R_6}{n+1}\right)$$

where Vs denotes the voltage applied to the sensing resistor, IL denotes the current flowing through the inductor, $R_s$ denotes the sensing resistor, $R_6$ denotes the turn-on resistance of the second turn-on transistor, $R_f$ denotes the feedback resistor, and n denotes the ratio of the width of the second main transistor to the width of the second sub-transistor and the second turn-on transistor.

10. The apparatus of claim 1, wherein the current application stage further comprises a level shifter configured to change a level of the voltage applied to the first input terminal or the second input terminal.

* * * * *